United States Patent [19]
Barsan

[11] Patent Number: 5,959,336
[45] Date of Patent: *Sep. 28, 1999

[54] DECODER CIRCUIT WITH SHORT CHANNEL DEPLETION TRANSISTORS

[75] Inventor: Radu M. Barsan, Cupertino, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/702,846

[22] Filed: Aug. 26, 1996

[51] Int. Cl.$^6$ .................................................. H07L 29/78
[52] U.S. Cl. .......................................... 257/391; 257/907
[58] Field of Search .................................... 257/392, 391, 257/402, 403, 904, 903

[56] References Cited

U.S. PATENT DOCUMENTS

| | | | |
|---|---|---|---|
| 4,329,186 | 5/1982 | Kotecha et al. | 257/392 |
| 4,410,904 | 10/1983 | Wollesen | 257/391 |
| 5,592,012 | 1/1997 | Kubota | 257/392 |

FOREIGN PATENT DOCUMENTS

| | | | |
|---|---|---|---|
| 442-413 | 8/1991 | European Pat. Off. | 257/392 |
| 2-224369 | 9/1990 | Japan | 257/392 |

*Primary Examiner*—David B. Hardy
*Attorney, Agent, or Firm*—Fliesler,Dubb, Meyer & Lovejoy LLP

[57] ABSTRACT

A decoder circuit formed on an integrated circuit substrate including at least one short channel depletion transistor having a low resistance path formed between the source and the drain regions. The low resistance path is provided by an implant into the channel region that forms a depletion channel wherein the channel region has a length less than a length of a channel region of transistors in the decoder circuit that handle input/output voltage levels for the decoder circuit.

9 Claims, 3 Drawing Sheets

DECODER CIRCUIT WITH SHORT CHANNEL DEPLETION TRANSISTORS

BACKGROUND OF THE INVENTION

1. Field of the Invention

The present invention pertains to the field of integrated circuits. More particularly, this invention relates to a decoder circuit having short channel depletion transistors that yield low resistance signal paths.

2. Description of the Related Art

Integrated circuit devices such as programmable logic devices or non-volatile memory devices typically include a variety of decoder circuits. Such decoder circuits are commonly implemented as arrays of transistors. Such an array usually includes multiple columns of series coupled transistors. Typically, multiple rows of polysilicon lines provide connections to the gates of the transistor columns.

The decoding function for such a decoder circuit is commonly preset during integrated circuit device manufacturing steps. Such steps usually include the formation of a low resistance or short circuit signal paths between the source and drain regions of selected transistors in the decoder circuit.

One prior technique for forming a low resistance signal path between the source and drain regions of a transistor in such a decoder circuit involves the formation of a programming junction within the channel region of the transistor. Typically, such a programming junction is formed with a high energy high dose n+ implant into the channel region of the transistor before the formation of the polysilicon gate structure of the transistor. Such an n+ implant usually yields a low resistance path and effectively creates a short circuit between source and drain in the transistor.

Unfortunately, such a high energy implant for the programming junction usually damages the surface of the silicon wafer and creates various types of surface imperfections on the silicon wafer. Such imperfections typically reduce the quality of a gate oxide layer subsequently formed on the damaged surface over the programming junction. Such a poor quality gate oxide is commonly subject to breakdown and which may cause short circuiting between the polysilicon gate and the channel region of the transistor and consequential failure of the decoder circuit.

Such gate oxide breakdown is an even greater problem in decoder circuits that operate at voltages higher than the VCC supply voltage to the integrated circuit device. Such decoder circuitry that operates at high voltages is common in programmable logic devices and non-volatile memories that employ high voltages in high speed logic.

Another prior technique for forming a low resistance signal path between the source and drain regions of a transistor in such a decoder circuit involves the formation of a salicidation local interconnect structure above the polysilicon gate. Such a local interconnect typically involves the reaction of a titanium layer and an amorphous silicon layer onto an oxide layer that protects the polysilicon gate. Unfortunately, such salicidation structures are typically difficult to scale down to smaller and smaller dimensions on the silicon wafer substrate due to the reflections caused by the amorphous silicon and titanium layers during the photolithography steps.

Yet another prior art method for forming a low resistance signal path between the source and drain regions of a transistor involves using a Metal I layer over the surface of the silicon gate layer and forming contacts on the surface of the source and drain regions. Such an "overpass" structure is difficult to scale down to small dimensions.

SUMMARY AND OBJECTS OF THE INVENTION

One object of the present invention is to provide a decoder circuit for a high density integrated circuit device.

Another object of the present invention is to provide a high density decoder circuit that operates above the VCC supply voltage level of the integrated circuit device.

Another object of the present invention is to provide a compact decoder circuit that does not require extra process steps during integrated circuit device manufacture.

These and other objects are provided by a decoder circuit formed on an integrated circuit substrate wherein the decoder circuit includes at least one short channel depletion transistor. The short channel depletion transistor has a low resistance path between the source and the drain regions provided by an implant into the channel region that provides a depletion channel wherein the channel region has a length less than a length of a channel region of a transistor in the decoder circuit that handles an input/output voltage level for the decoder circuit.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
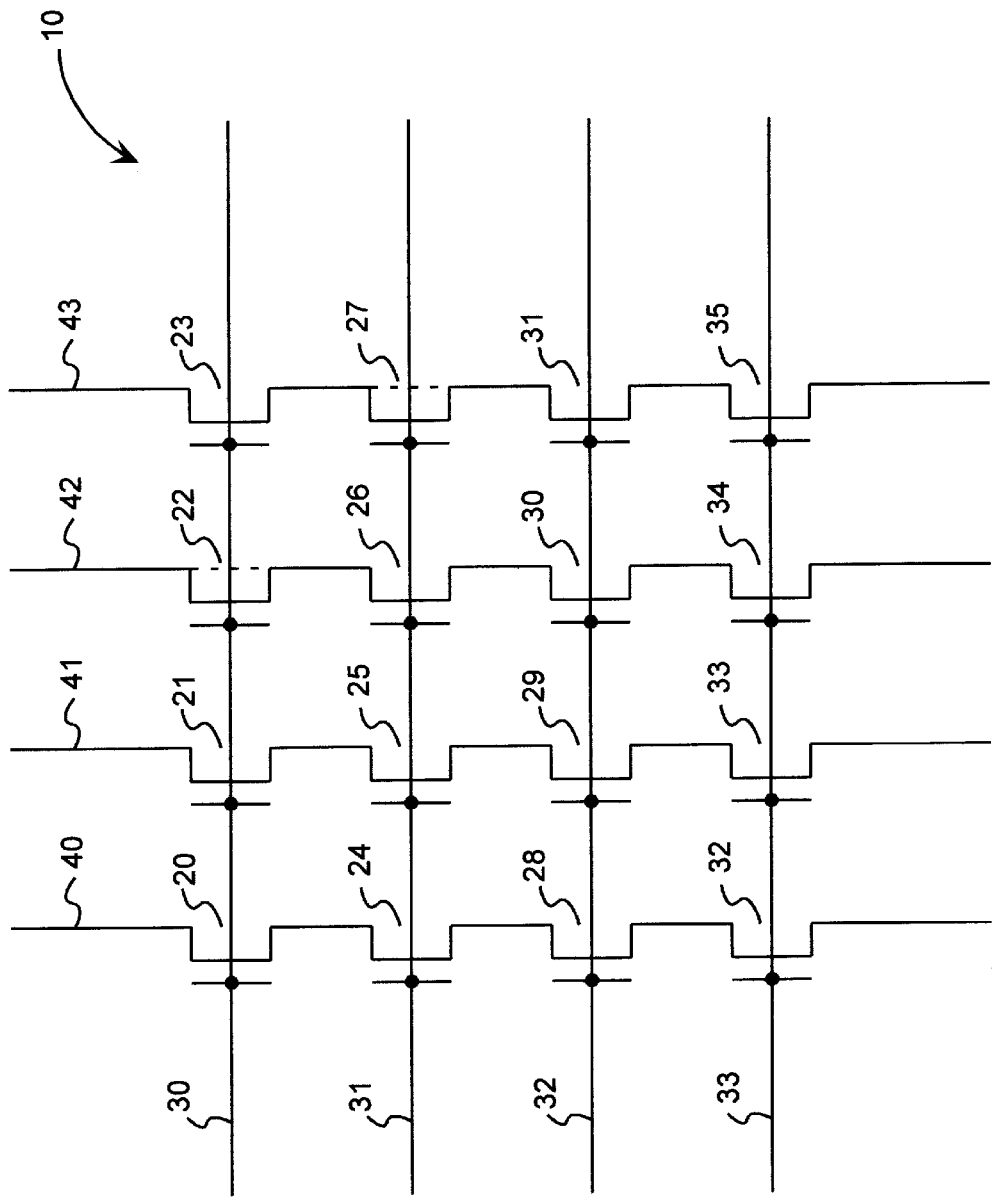
FIG. 1 illustrates a decoder circuit suitable for implementation on a high density integrated circuit.

FIG. 1 illustrates a decoder circuit 10 suitable for implementation on a high density integrated circuit. The decoder circuit 10 includes an array of transistors 20–35. The decoder circuit 10 includes a set of input signal lines 30–33 and a set of output signal lines 40–43. The input and output signal lines 30–33 and 40–43 carry input/output voltage levels which may be higher than the VCC supply level for the integrated circuit chip that contains the decoder circuit 10.

A preselected decoding function for the decoder circuit 10 determines the relationship between input signals on the input signal lines 30–33 and output signals on the output signal lines 40–43. The decoding function of the decoder circuit 10 is preprogrammed or preset during integrated circuit device manufacture by the formation of low resistant paths between the source and drain regions of selected ones of the transistors 20–35. In this example, low resistance signal paths are formed between the source and drain regions of the transistor 22 and the source and drain regions of the transistor 27.

Figure 2:
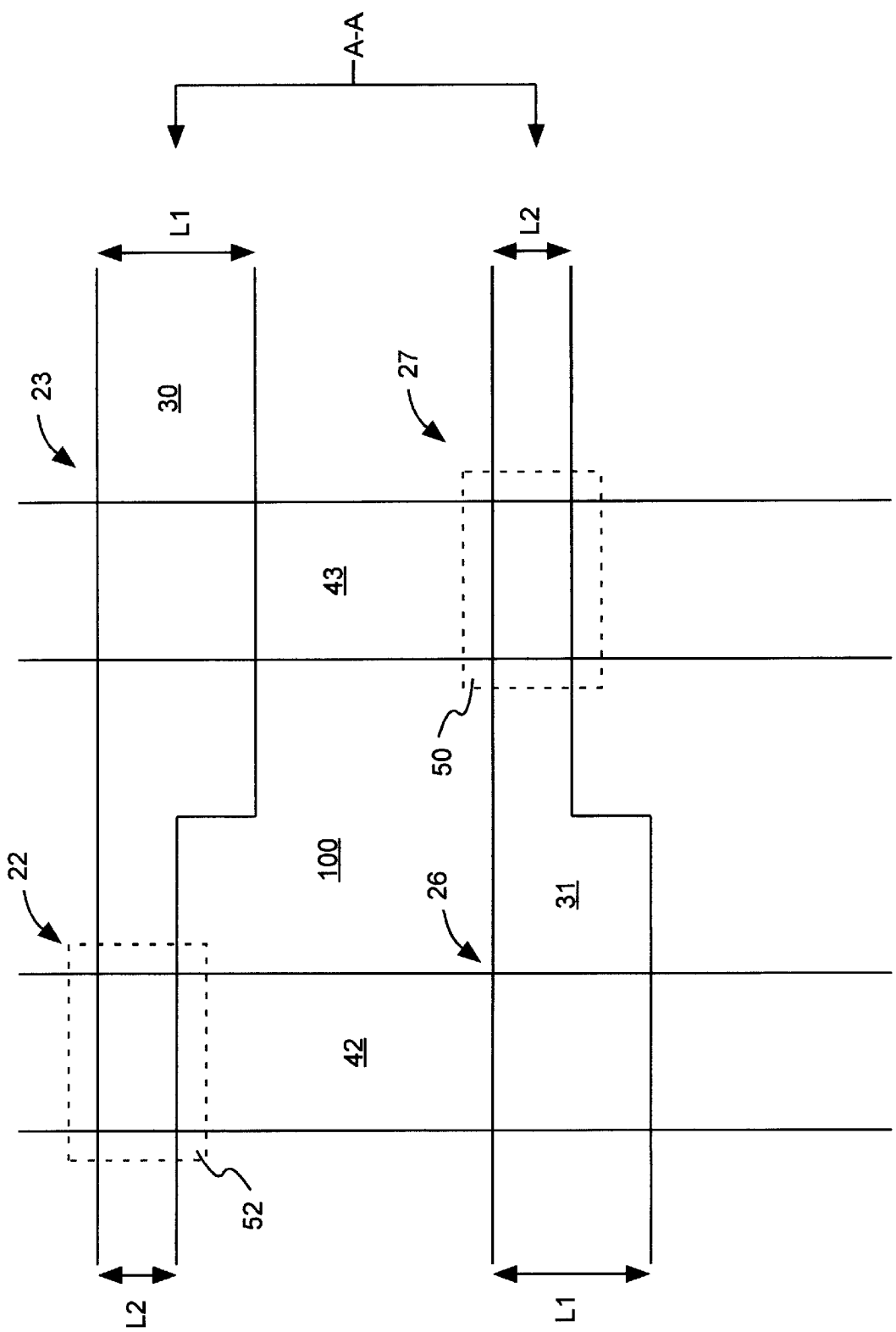
FIG. 2 illustrates a top view of a portion of the decoder circuit implemented on a silicon substrate.

FIG. 2 illustrates a top view of a portion of the decoder circuit 10 implemented on a silicon substrate 100 in one embodiment. This top view shows the transistors 22, 23, 26, and 27 which are formed onto the silicon substrate 100. The output signal lines 42 and 43 are doped regions formed in the silicon substrate 100. The doped regions 42 and 43 include the source/drain diffusion regions and the doped drain regions of the transistors 22, 23, 26, and 27.

The input signal lines 30 and 31 are implemented as polysilicon lines formed on the surface of corresponding gate oxide layers 70,71, which are formed on an upper surface of the silicon substrate 100. In the regions of the transistors 22, 23, 26, and 27, the polysilicon structures 30 and 31 provide polysilicon gate structures for the transistors.

The transistors 22 and 27 are each implemented as short channel depletion transistors on the silicon substrate 100. The short channel depletion structures provide a relatively low resistance and effectively short circuit signal path between the source and the drain region of the transistor 22 and between the source and the drain region of the transistor 27.

The short channel depletion structure of the transistor 27, for example, is realized by a depletion implant region 50 formed in the silicon substrate 100 and a narrowing of the polysilicon structure 31 over the channel region of the transistor 27. The depletion implant region 50 is a region having the same polarity as the source and drain regions of the transistor. The relatively narrow dimension L2 of the polysilicon structure 31 controls the channel length L2 of the transistor 27.

The narrow dimension L2 of the polysilicon structure 31 is formed according to the minimum feature size available for the particular process technology employed. In contrast, the wide dimension L1 of the polysilicon structure 31 is selected so that the transistor 26 can handle the high voltages associated with the input signal lines 30–33 and the output signal lines 40–43. In general, a "short channel" transistor has certain characteristics based on its performance relative to its physical channel length, gate oxide thickness and response to signals applied to its gate, source and drain. When such devices are scaled, if the channel length is reduced, the gate oxide is correspondingly reduced to maintain the operational characteristics of a short-channel device. In one embodiment of the present invention, the wide dimension L1 is approximately 0.8 microns and the narrow dimension L2 is approximately 0.35 microns for a 0.35 micron process technology. However, in a unique aspect of the invention, for both transistor types, the gate oxide thickness of gate oxides 70,71 is the same, for example, about 150 Å.

As a result, transistors 22,27 have a very high conductance which is not a function of the voltage applied to their gate (lines 30,31), and transistors 23,26 operate in a conventional manner.

The depletion implant region 50 is formed with a depletion level dose of an arsenic implant. The depletion implant regions for the short channel depletion transistors in the decoder circuit 10 including the depletion implant region 50 are formed during the same process steps that form depletion mode normal size transistors on other areas of the silicon substrate 100. In one embodiment, the depletion level dose of arsenic implant is approximately $2.5 \times 10^{12}/cm^2$.

In general, a depletion region formed in the channel of a transistor yields a transistor with a negative threshold voltage Vt. Such a transistor is capable of electrical conduction when 0 volts is applied to its gate. The normal high voltage transistors, such as the transistors 23 and 26, implemented in the decoder circuit 10 have channel regions doped with a boron implant that yields a positive threshold voltage Vt.

The depletion level dose in the region 50 is low in comparison to a programming junction implant dose of, for example, $1 \times 10^{15}/cm^2$ and by itself does not yield the desired low resistance path in a transistor having a normal channel length L1. However, sufficient electrical conduction occurs in the depletion implant region 50 when the channel length is reduced to L2 while the gate oxide thickness is kept as thick as the 0.8 micron device. Moreover, the dopant level of the depletion implant region 50 yields a relatively high quality gate oxide layer during the gate oxide formation process steps.

Similarly, the short channel depletion structure of the transistor 27 is realized by a depletion implant region 50 formed in the silicon substrate 100 and a narrowing of the polysilicon structure 31 to the dimension L2. The wide dimension L1 of the polysilicon structure 31 allows for the transistor 27 to operate at voltages which in one embodiment exceed the VCC supply voltage for the integrated circuit that contains the decoder circuit 10.

Figure 3:
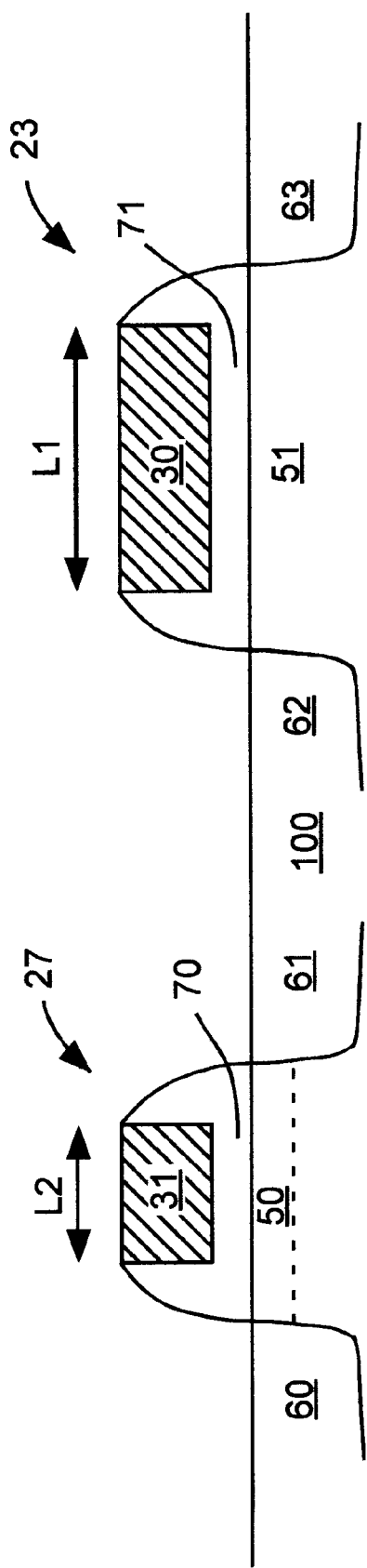
FIG. 3 provides a view along cross-section A—A of the decoder circuit formed on the silicon substrate.

FIG. 3 provides a view along cross-section A—A of the decoder circuit 10 formed on the silicon substrate 100. The transistor 27 which is a short channel depletion transistor is shown in comparison to the transistor 23 which is a normal high voltage n-type transistor.

The polysilicon gate 31 of the transistor 27 is separated from a surface of the silicon substrate 100 by a gate oxide layer 70. The transistor 27 includes a pair of source/drain diffusion regions 60 and 61 which are subregions of the doped region 43. The combination of the depletion implant region 50 formed in the silicon substrate 100 and the relatively narrow dimension L2 of the polysilicon gate 31 and the thick gate oxide yields a short channel depletion transistor and a relatively low resistance path between the source/drain regions 60 and 61 of the transistor 27 independent of the gate voltage.

The transistor 23 includes a pair of source/drain diffusion regions 62 and 63 and a doped active region 51 which are subregions of the doped region 43. The active region 51 is formed with a boron implant into the silicon substrate 100 prior to the formation of the oxide layers 70 and 71. The depletion implant region 50 is masked during the boron implant into the active region 51. The depletion implant region 50 is masked to prevent any reduction in conductivity from the boron implant.

The polysilicon gate 30 of the transistor 23 is separated from a surface of the silicon substrate 100 by the gate oxide layer 71. The gate oxide layers 70-71 are formed in the same process step and are approximately 150 Å thick in order to provide electrical isolation of the polysilicon gates 30 and 31 and proper transistor operation in the high voltage environment of the decoding device 10.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A decoder circuit formed on an integrated circuit substrate, comprising:
   a first transistor having a source region, a drain region and a channel region formed in the substrate and having a low resistance path between the source and the drain regions provided by an implant into the channel region that provides a depletion channel;
   a second transistor having a source region, a drain region and a channel region formed in the substrate; and
   at least one polysilicon structure on the substrate that provides an input signal path to the decoder circuit and that provides a first and a second gate structures for the respective first and second transistors;

wherein the channel region of the first transistor has a length less than a length of the channel region of the second transistor in the decoder circuit, and the first gate structure has a first width defined by a first edge and a second edge opposing and generally parallel to the first edge over the channel region of the first transistor and a second width defined by said first edge, and a third edge opposing and generally parallel to the first edge over the channel region of the second transistor, wherein the first width corresponds to a minimum feature size available with a process technology used to form the decoder circuit on the substrate, and wherein the first transistor is conductive between the source and drain regions when a voltage of approximately zero volts is applied to the first gate structure.

2. The decoder circuit of claim 1, wherein the polysilicon structure controls the length of the channel region of the transistor and the length of the channel region of the transistor in the decoder circuit that handles the input/output voltage level.

3. The decoder circuit of claim 2, wherein the second width is selected according to the input/output voltage level.

4. The decoder circuit of claim 3, wherein the input/output voltage level is greater than a VCC supply voltage for other circuitry contained on the substrate.

5. A decoder circuit formed on an integrated circuit substrate, comprising:

a first transistor having a source region, a drain region and a channel region formed in the substrate and having a low resistance path between the source and the drain regions provided by an implant into the channel region that provides a depletion channel;

a second transistor having a source region, a drain region and a channel region formed in the substrate; and at least one polysilicon structure on the substrate that provides an input signal path to the decoder circuit and that provides a first and a second gate structures for the respective first and second transistors;

wherein the channel region of the first transistor has a length less than a length of the channel region of the second transistor in the decoder circuit, and the first gate structure has a first width defined by a first edge and a second edge opposing and parallel to the first edge over the channel region of the first transistor and a second width defined by said first edge, and a third edge opposing and parallel to the first edge over the channel region of the second transistor, wherein the first width corresponds to a minimum feature size available with a process technology used to form the decoder circuit on the substrate, and wherein the first transistor is conductive between the source and drain regions when a voltage of approximately zero volts is applied to the first gate structure.

6. The decoder circuit of claim 5, wherein the first width is approximately 0.35 microns.

7. The decoder circuit of claim 5, wherein the second width is approximately 0.8 microns.

8. The decoder circuit of claim 5, wherein the first and second gate structures have gate oxide thicknesses of approximately 150 Å.

9. A decoder circuit formed on an integrated circuit substrate, comprising:

a first transistor having a source region, a drain region and a channel region formed in the substrate and having a low resistance path between the source and the drain regions provided by an implant into the channel region that provides a depletion channel;

a second transistor having a source region, a drain region and a channel region formed in the substrate; and at least one polysilicon structure on the substrate that provides an input signal path to the decoder circuit and that provides a first and a second gate structures for the respective first and second transistors;

wherein the channel region of the first transistor has a length less than a length of the channel region of the second transistor in the decoder circuit, and the first gate structure has a first width defined by a first edge and a second edge opposing and parallel to the first edge over the channel region of the first transistor and a second width defined by said first edge, and a third edge opposing and parallel to the first edge over the channel region of the second transistor, wherein the first width is approximately 0.35 microns; and wherein the first transistor is conductive between the source and drain regions when a voltage of approximately zero volts is applied to the first gate structure.

* * * * *